US006456019B1

(12) United States Patent
Gordon et al.

(10) Patent No.: US 6,456,019 B1
(45) Date of Patent: Sep. 24, 2002

(54) REAL TIME MEASUREMENT OF LEAKAGE CURRENT IN HIGH VOLTAGE ELECTRON GUNS

(75) Inventors: Michael Stuart Gordon, Lincolndale; Samuel Kay Doran, Wappingers Falls, both of NY (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/775,762

(22) Filed: Feb. 3, 2001

(51) Int. Cl.[7] .................................................. G09G 1/04
(52) U.S. Cl. ........................ 315/383; 315/389; 315/10; 250/492.23; 250/492.3
(58) Field of Search .............................. 315/379, 383, 315/384–389, 398, 307, 10; 250/396 R, 397, 400, 427, 429, 492.23, 492.3

(56) References Cited

U.S. PATENT DOCUMENTS

| | | | |
|---|---|---|---|
| 4,000,440 A | 12/1976 | Hall et al. ..................... 315/383 |
| 4,340,904 A | * 7/1982 | Wingrove, Jr. ............... 348/180 |
| 4,568,861 A | 2/1986 | Doran et al. .................. 315/379 |
| 4,608,493 A | 8/1986 | Hayafuji ....................... 250/397 |
| 5,030,908 A | * 7/1991 | Miyoshi et al. .............. 324/751 |
| 5,278,476 A | * 1/1994 | Ten Pierick et al. ......... 315/383 |
| 5,716,742 A | 2/1998 | Doran .......................... 430/422 |
| 5,739,654 A | 4/1998 | Doran et al. ................. 318/561 |
| 5,825,035 A | * 10/1998 | Mizumura et al. ....... 250/423 R |
| 6,137,111 A | * 10/2000 | Yamada et al. ........... 250/491.1 |

* cited by examiner

*Primary Examiner*—Haissa Philogene
(74) *Attorney, Agent, or Firm*—Graham S. Jones, II (57) ABSTRACT

A method and a apparatus are provided for operating an E-beam system including an E-beam source for generating an E-beam directed along a column axis and an electrode aligned with the column axis direct the E-beam towards means for measuring the E-beam. A signal proportional to leakage current emitted from the E-beam is generated. When the result of a comparison with a desired value is excessive, an excess leakage signal is generated. The excess leakage signal can be provided as an emergency output signal and/or produce an OFF signal for stopping production of the E-beam by turning OFF voltage/power sources for producing the E-beam in response to the excess leakage signal. Preferably, a filament is heated by an electric current and a cathode is bombarded with electrons from the filament to produce the E-beam. Then a filament control signal is employed for controlling the filament heating current.

29 Claims, 7 Drawing Sheets

REAL TIME MEASUREMENT OF LEAKAGE CURRENT IN HIGH VOLTAGE ELECTRON GUNS

BACKGROUND OF THE INVENTION

1. Field of the Invention

This invention relates to electron guns and more particularly to measurement of current leakage and providing a response to current leakage in electron guns.

2. Description of Related Art

Electron beam lithography systems typically operate at acceleration voltages of 10–100 kV. Leakage current, which can be caused by dirty high voltage insulators, is detrimental for the following reasons:

(1) excessive leakage leads to beam current instability;
(2) excessive leakage at high voltages can lead to high values of x-ray emission out of the gun; and
(3) excessive leakage can lead to an arc which can damage static-sensitive components.

To date, no method exists for measuring leakage current in real-time.

U.S. Pat. No. 3,885,194 of Schumacher for "Temperature Control for an Indirectly Heated Cathode for a High Power Electron Beam Gun" shows an electron beam welding system with an electron gun with a bolt cathode surrounded by an auxiliary cathode in the form of a tungsten filament which generates electrons which bombard the cathode. There is a filament power supply connected to provide excitation and heating of the auxiliary cathode. There is a voltage supply which energizes the filament power supply. The voltage supply produces a voltage which varies in response to feedback in the form of a control signal from a sensing member which may be a current measuring device which is employed to estimate the cathode temperature as a function of current therethrough. There is a variable potential source which is connected to energize a circuit which includes an annular auxiliary anode, the cathode and the sensing member.

U.S. Pat. No. 4,000,440 of Hall et al. for "Method and Apparatus for Controlling Brightness and Alignment of a Beam of Charged Particles" shows an E-beam system with a electron gun which produces a beam of electrons. In that system, it was necessary to assure that the current density of the E-beam would have a uniform current density. To that end it was also necessary to assure that the brightness of the E-beam be maintained near a constant level. As stated by Hall "Because the brightness depends upon the relationship between the temperature of the cathode and cathode emission, it is necessary to correct for beam brightness of the beam if the beam is to be properly aligned." That was because "a slight change in the temperature of the cathode heater can cause a substantial change in the current density of the beam through substantially changing the total beam current. If the beam does not have the desired total current it . . . cannot be properly aligned."

"If the beam is not properly aligned, the current for the cathode heater current might be increased until a maximum beam current was produced by the cathode . . ." to put the beam current in a desired range. Such a condition would endanger a reduction in the life of the cathode. In Hall et al., the brightness level is controlled without having to increase the heater current to obtain a maximum current output from the cathode.

U.S. Pat. No. 4,568,861 of Doran et al. for "Method and Apparatus for Controlling Alignment and Brightness of an Electron Beam" shows a E-beam system with a beam shaping aperture having an output connected to the input of an operational (I-E) amplifier. The output of the I-E amplifier is connected to the input of a voltage-to-frequency converter (V/F) which passes through a NAND gate to its output. The output of the NAND gate is supplied to a series of up-counters so that at the end of one "dither cycle" the counters store a count proportional to the total beam current collected by the shaping aperture plate during that dither cycle. The count in the up-counters is transferred by a data bus and a microprocessor to a brightness digital-to-analog (DAC) converter which outputs a D.C. voltage to the filament power supply so that the power to the filament varies as a function of the difference between the output of the DAC and a reference voltage which corresponds to the desired brightness of the beam.

In shaped-beam electron beam lithography machines, the beam is "servoed" periodically, to ensure that it is centered in the apertures, and that the beam current measured at some reference point (sample aperture or Faraday cup) is constant. Emission from the electron source is adjusted, or servoed, when needed to ensure that the beam current at this reference point is held constant. A similar beam servo technique will occur on an Electron Bean Projection System (EBPS) column. However, it is expected that the servoing which will occur about once per wafer and will not affect throughput of the tool.

When a leakage current exists in an electron gun, there is a reduction in the efficiency of the current from the high voltage power supply output. For example, suppose that the high voltage unit is set to 1000 $\mu$A to produce a target current of 25 $\mu$A in a projection electron beam system. The difference between the 1000 $\mu$A and the 25 $\mu$A target current is due to the beam current being trimmed at a series of apertures in the system. An upper aperture (shaping aperture in an EBPS system) can typically stop at least ½ of the beam current incident on it. Any change in current on this upper aperture, with respect to the current that the high voltage unit is producing, is a measure of the leakage current in the electron gun. If a 20 $\mu$A current leakage path develops in the electron gun, then the useful current from the high voltage unit is reduced by 20 $\mu$A (and in the example above, the target current is reduced by 0.5 $\mu$A). The conventional servo, as outlined above, would detect that the current at the target has dropped by 0.5 $\mu$A, and raise the emission of the high voltage unit to 1020 $\mu$A to compensate for the leakage. The emission current from the high voltage unit is not recorded on present-day systems, so no record of this leakage results. Also, real-time current on the wafer needs to be stable.

Monitoring the current from the high voltage unit, after each servo update, and comparing to a reference current is an effective way of determining the leakage current, but slow, since it is updated only during the servo cycle.

SUMMARY OF THE INVENTION

In accordance with this invention, a method and a system are provided for operating an E-beam system including an E-beam source for generating an E-beam. directed along a column axis. Direct the E-beamn towards means for measuring a parameter of the E-beam. Generate a leakage signal representing leakage current emitted from the E-beam, and generate an excess leakage signal when the result of a comparison with a desired value is excessive. The excess leakage signal can be provided as an emergency output signal and/or produce an OFF signal for stopping production of the E-beam by turning OFF voltage/power sources for producing the E-beam in response to the excess leakage signal. Preferably, a filament is heated by an electric current and a cathode is bombarded with electrons from the filament to produce the E-beam. Then a filament control signal is employed for controlling the filament heating current.

Preferably produce the E-beam by heating the filament for emitting electrons proximate to a cathode aligned therewith, and provide a conductive aperture located along the column axis. Provide an adjustable filament emission power for generating an output to accelerate electrons from the filament to bombard the cathode. Supply cathode emission power supply for generating a cathode emission current and voltage to accelerate the E-beam from the cathode along the column axis. Measure the cathode emission current. Provide for the conductive aperture to be adapted to intercept electrons from the cathode, thereby producing an aperture current. Measure the aperture current. Generate a ratio of the aperture current to the cathode emission current. Test to determine whether the ratio is within a limit, and generate an excess leakage output signal when the ratio is outside of the limit. Preferably, generate an emergency output signal when the ratio is outside of the limit; provide a filament control signal for adjusting filament emission power; and provide an, OFF signal for causing turning off power supplied to the E-beam when the ratio is outside of the limit by generating an excess leakage signal.

In accordance with another aspect of the method and system of this invention, provide an electron gun including a filament, a cathode located along the axis below the filament, and a shaping aperture located along the column axis below the cathode. Provide a first voltage source for heating the filament to cause thermionic emission of electrons. Provide a second voltage source for supplying a bombardment accelerating voltage to direct the electrons along the column axis towards the cathode. Provide a third voltage source coupled to the shaping aperture for supplying a beam accelerating voltage to direct an E-beam generally along the column axis, the E-beam comprising energized electrons couple to the beam accelerating voltage. Generate an emission current signal representing the electron source current emitted from the electron source. Generate a shaping aperture current signal representing current flow at the shaping aperture. Compare the shaping aperture current signal and the current emission current signal and provide a comparison ratio output signal. Test to determine whether the comparison ratio output signal is within a limit. Generate an output signal when the comparison output signal is outside the limit.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
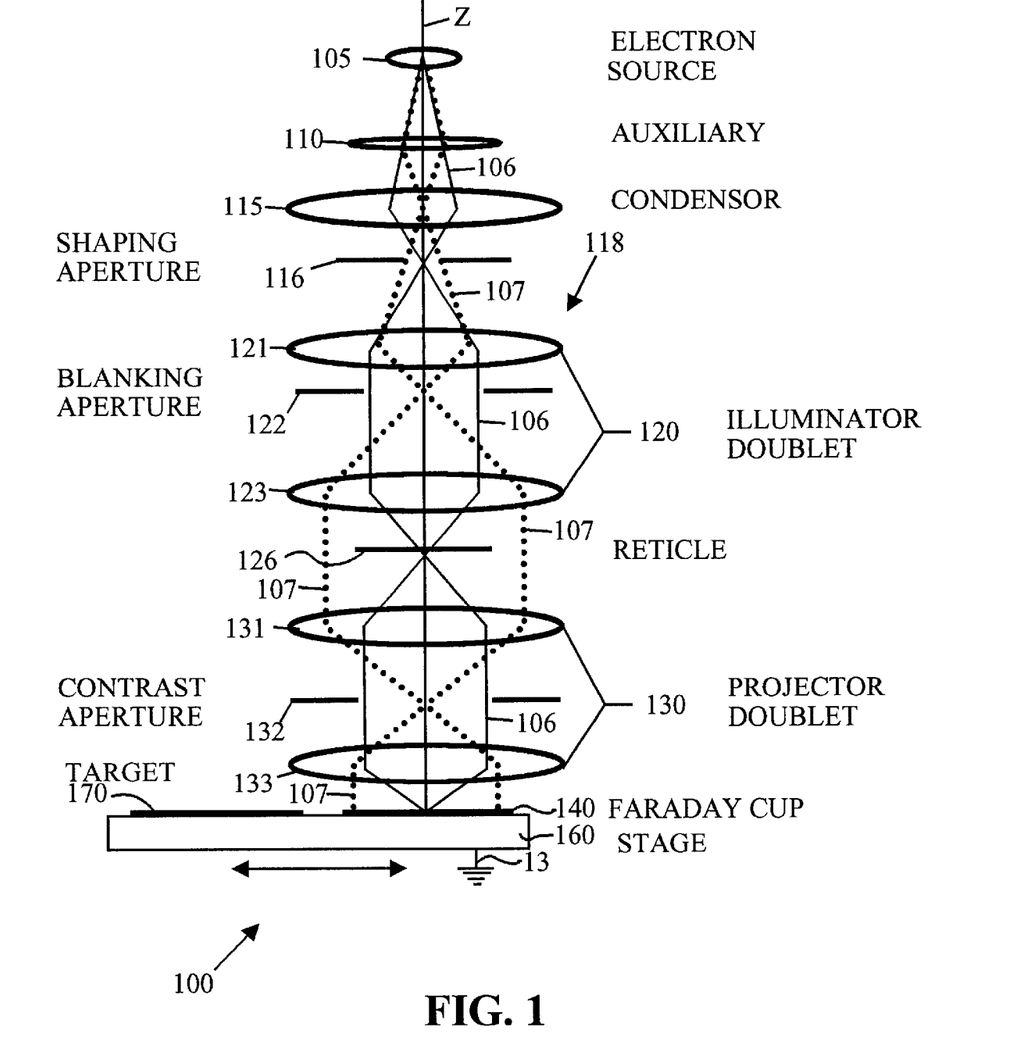
FIG. 1 shows a schematic representation of an electron beam projection lithography machine.

FIG. 1 shows a schematic representation of an electron beam (E-beam) projection lithography machine 100. At the top of the machine 100 is electron emission source 105 which produces an E-beam 106 directed along the central Z axis of the machine 100. The electron gun in the electron emission source 105 of such a machine 100 has a certain emission characteristic. Note that FIG. 2 shows that emission source 105 includes a filament 101 and a cathode 103.

Below the electron emission source 105 is an auxiliary lens 110. Next is a condenser lens 115 followed by a shaping aperture 116 which yields the shaping aperture imaging rays 107. There is a column 118 below the shaping aperture 116. The column 118 includes a series of elements aligned with the Z-axis. At the top of the column 118 is an illuminator doublet 120 formed by upper illuminator lens 121 and lower illuminator lens 123. A blanking aperture 122 is located between the upper illuminator lens 121 and the lower illuminator lens 123. Next follows a reticle 126 aligned with the Z-axis of machine 100. Farther down the column 118 below the reticle 126 is a projector doublet 130. The projector doublet 130 includes an upper projector lens 131 and a lower projector lens 133. A contrast aperture 132 is located between the upper lens 131 and lower lens 133 of the projector doublet 130.

Figure 2:
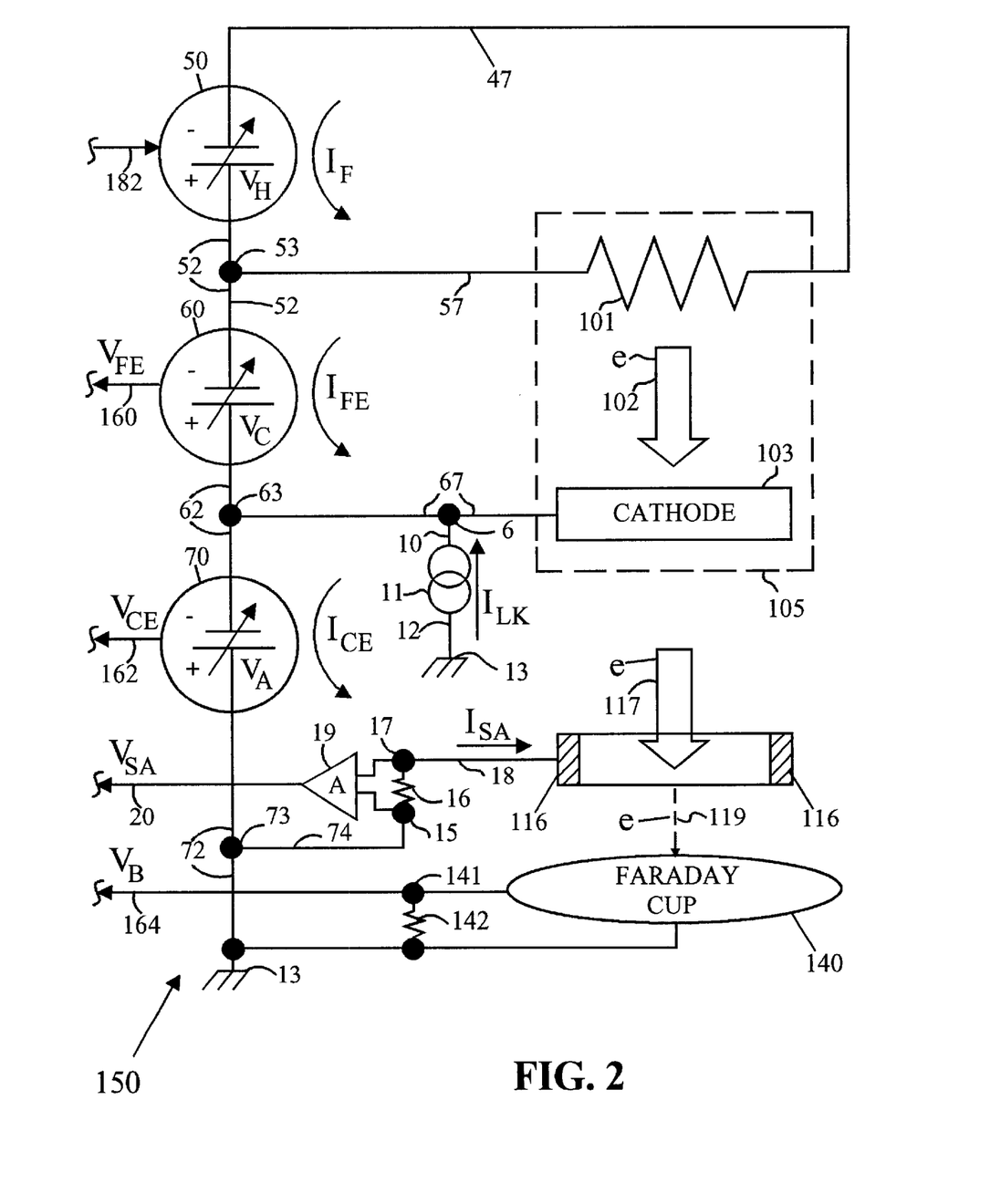
FIG. 2 shows a schematic for the current flows for Electron Emission Source (EES).
Figure 3:
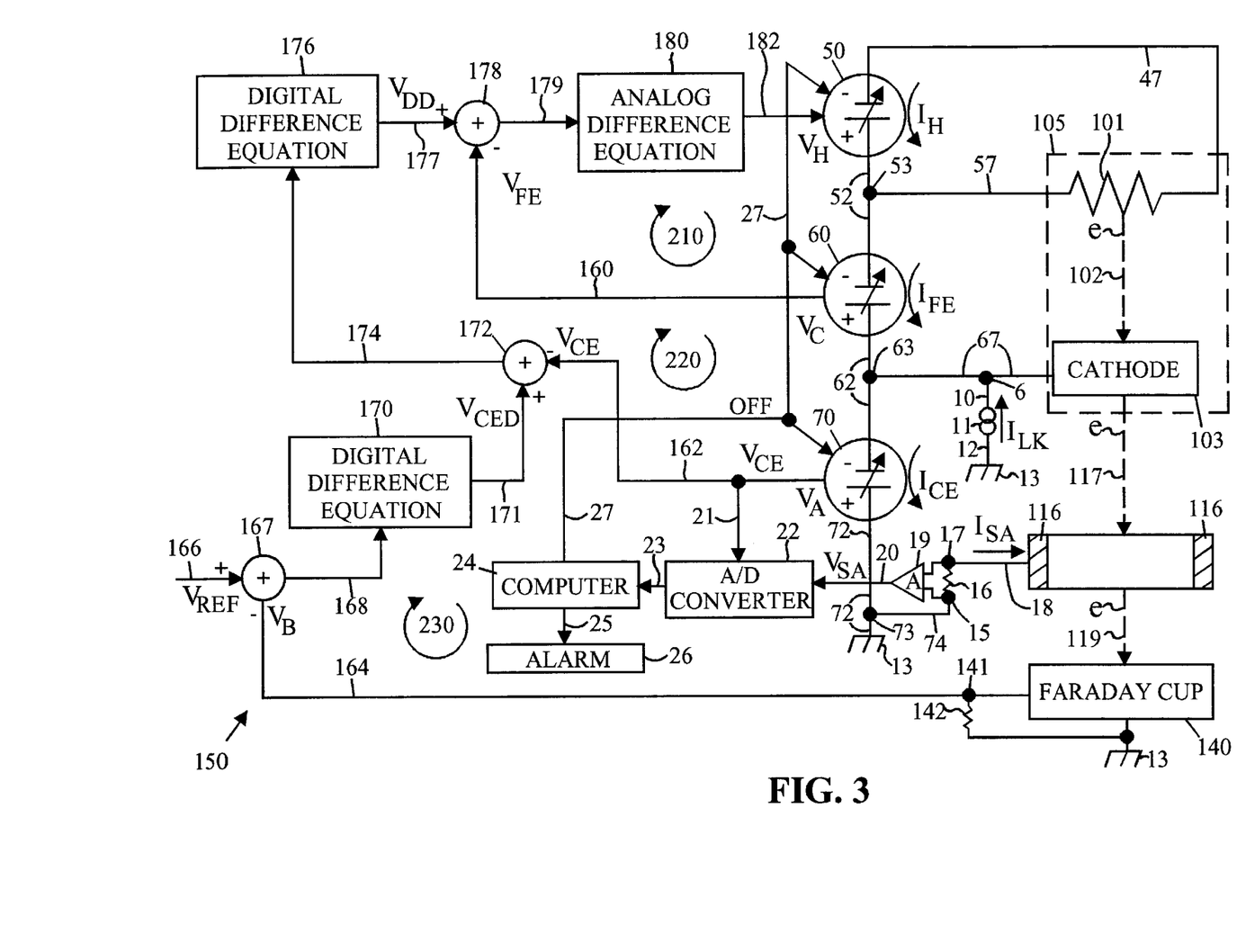
FIG. 3 shows the circuit of FIG. 2 with three cascaded servo loops that are adapted to measure leakage current and to control the three power supplies $V_H$, $V_C$, and $V_A$ by driving their input voltage control lines that control their output voltages.

FIG. 2 is a simplified, schematic, functional diagram of a multiple closed loop system 150 (shown in more detail in FIG. 3). FIG. 2 includes several electrical circuits which energized and affect performance of the E-beam 106 of machine 100 in FIG. 1 including a set of the three ($V_H$, $V_C$, $V_A$) high voltage power supplies 50, 60, 70. There is an Electron Emission Source (EES) 105 (hereinafter referred to as the electron gun 105) in accordance with this invention. The electron gun 105 includes a filament 101 and a cathode 103. Depending upon the position of the stage 160 in FIG. 1, below the gun 105 are the shaping aperture 116, the blanking aperture 122, the reticle 126, and the contrast aperture 132, as well as the Faraday Cup 140 which is located below the shaping aperture 116. The $V_H$ filament power supply 50 is connected to a first end of the filament 101 through line 52, via node 53 and line 57. The opposite end of filament 101 is connected by line 47 to the negative terminal of the $V_H$ filament power supply 50.

The $V_H$ filament power supply 50 produces a filament heating current through the above described circuit which heats the filament 101. As a result, the heated filament 101 emits electrons (e) 102 by thermionic emission. The resulting electrons 102 which are emitted from the heated filament 101 are directed onto the cathode 103. The quantity of electrons 102 emitted from the filament 101 is a function of the filament temperature, the filament-to-cathode voltage $V_C$, and the filament work function. The voltage of $V_H$ filament power supply 50 is adapted to be adjusted by the input signal on line 182 which is discussed further below in connection with the description of FIG. 3.

The positive terminal of the $V_C$ bombardment voltage power supply 60 is connected through line 62 to node 63 to line 67 to the cathode 103 in the electron gun 105. Thus, lines 62 and 67 connect a positive bias voltage from power supply 60 to the cathode 103.

On the other hand, the negative terminal of the $V_C$ bombardment power supply 60 is connected through line 52 to the node 53 which is connected to the first end of the filament 101, as explained above. The purpose of the $V_C$ bombardment voltage 60 is to accelerate the electrons 102 emitted by the heated filament 101 toward the backside of the cathode 103. That purpose is achieved since the cathode 103 is less negatively biased than the filament 101, causing the electrons emitted from the filament 101 to be accelerated towards the cathode 103.

A current $I_{FE}$ (measured by voltage $V_{FE}$ on line 160 as explained below) flows through from bombardment voltage ($V_C$) power supply 60 through line 62 and node 63 towards the cathode 103 via line 67. The heating power (watts) supplied to the cathode 103 is equal to the product of the filament emission current $I_{FE}$ and the $V_C$ bombardment voltage 60. The temperature of the cathode 103 is the integral of the incoming power minus the radiated and conducted power from the cathode 103. The electrons 102 bombarding the large-area cathode 103 raise the temperature of cathode 103 until it is hot. The hot cathode 103 emits the electrons 117, some of which are shown passing through the shaping aperture 116.

The shaping aperture 116 is at ground potential. As stated above, the accelerated electrons 117 are directed downwardly towards or through the shaping aperture 116. Electrons 119 which are a fraction of electrons 117 which are not intercepted by the shaping aperture 116, blanking aperture 122, reticle 126 or contrast aperture 132 is available for lithographic exposure of the target 170 in FIG. 1. This current (electrons 119) can be measured by the Faraday cup 140 when it is aligned under the beam, and Faraday cup 140 measures the current incident upon it. In response to the incident current, Faraday cup 140 generates a current through node 141, shunt resistor 142 to ground 13, producing a voltage $V_B$ on line 164.

The current intercepted by the shaping aperture 116, which is on the order of 50%, is stripped off from the flow of accelerated electrons 117 passing through the shaping aperture 116.

The current $I_{SA}$ is measured in the shunt 16 which responds by sending a voltage $V_{SA}$ (representing $I_{SA}$) through the amplifier 19 onto line 20 to be employed as describe below in connection with the circuit of FIG. 3.

The value of the shaping aperture current $I_{SA}$ is measured in real-time by measuring the IR drop voltage proportional to the current through the shunt resistor 16 (which is connected as shown in FIG. 3).

The cathode emission current $I_{CE}$ is a function of the cathode temperature, the accelerating voltage $V_H$, and the cathode work function.

Referring to FIG. 3, an electron gun servo system maintains a constant cathode emission current that is measured by a circuit in the $V_A$ acceleration voltage power supply 70 as an analog voltage referred to herein as the cathode emission voltage $V_{CE}$ on line 162 which is proportional to the cathode emission current $I_{CE}$. Ideally, the cathode emission voltage $V_{CE}$ represents the total current emitted by the cathode 103. However, high voltage cables and insulators deteriorate with age and contamination accumulates over time, so, as a result, leakage paths develop to ground from the $V_A$ power supply 70. The alternate path for electrons by which electrons can reach ground is represented by the leakage current $I_{LK}$ from ground 13 through line 12 parasitic element 11 and line 10 to node 6, which is connected to line 67 which connects the cathode 103 and connects through the node 63 to the power supply $V_C$ 60. Leakage current $I_{LK}$ represents the total leakage current $I_{LK}$ from all possible sources.

The problem being dealt with in this invention is that the leakage current $I_{LK}$ through the adverse effect of the parasitic leakage element 11 can build up without being detected and can produce x-rays and E-beam instabilities. The gun servo maintains a constant current in $V_A$ acceleration voltage power supply 70 that is sufficient to achieve the proper current at the Faraday cup 140 and target 170, but provides no direct way to measure leakage current $I_{LK}$.

In a preferred embodiment of the invention, the emitter surface. of the electrons contained in electron emission source 105, is imaged to the shaping aperture 116, and the first source crossover is imaged using the auxiliary lens 110 to the plane of the condenser lens 115. Other source crossovers are located at the plane of the blanking aperture 122 and at the plane of the contrast aperture 132 which is at the front focal plane of the lower lens 133 of the projector doublet 130. The illuminator doublet 120 is used to project the shaping aperture 116 to the reticle 126 with the proper magnification. The projector doublet 130 projects a demagnified image of the reticle 126 to the wafer plane of target wafer 170. The alignment of the E-beam down through the column is servoed so the E-beam stays centered through the shaping aperture 116 and blanking aperture 122 and reticle 126 and contrast aperture 132, if desired. One can measure the current periodically on a Faraday cup 140 as follows:

1) at the reticle stage if servoing the shaping aperture 116 and the blanking aperture 122, or
2) at the wafer stage if servoing the shaping aperture 116, the blanking aperture 122, the contrast aperture 132, and the reticle 126, and if the current seems to change slowly because something is aging, one can increase the filament bombardment power to maintain constant current at the target 170. The problem is that the gun can develop leakage current to ground which can be caused by a dirty insulator, for instance. There has been no really good way to measure leakage current which can vary over real time.

This invention provides a way to measure the real time characteristics of leakage current $I_{LK}$. In accordance with this invention, a faster real-time measurement of the leakage current is provided by comparing the shaping aperture current ($I_{SA}$) (intercepted by the shaping aperture 116) to the cathode emission current $I_{CE}$ (emission from the cathode 103 in the electron emission source 105) in a comparison circuit. The comparison circuit is designed and programmed in such a way that it can determine the amount of the leakage current ($I_{LK}$) or whether there were changes in the characteristics of the electron gun 100.

Assuming a cathode emission current $I_{CE}$ of 1000 µA and a transmission of the shaping aperture of 0.5 (50%), i.e. 500 µA, one would expect the ratio of the current $I_{SA}$ through the shaping aperture to the cathode emission current $I_{CE}$ to be 0.5.

Table I below shows four cases comparing cathode emission currents, leakage currents, current intercepted by the shaping aperture and the ratio of the current on the shaping aperture to the cathode emission current.

TABLE I

| Case | Cathode Emission Current ($I_{CE}$) Measured at High Voltage Unit (µA) | Leakage Current ($I_{LK}$) (µA) | Current intercepted by shaping aperture ($I_{SA}$) (µA) | Ratio |
|---|---|---|---|---|
| A | 1000 | 0 | 500 | 0.5000 |
| B | 1000 | 20 | 490 | 0.4900 |
| C | 1020 | 20 | 500 | 0.4902 |
| D | 1020 | 0 | 510 | 0.5000 |

CASE A: Leakage current $I_{LK}$=0. The cathode has a cathode emission current $I_{CE}$ of 1000 µA and the current intercepted by the shaping aperture 116, $I_{SA}$=500 µA. Therefore the ratio of current intercepted by the shaping aperture 116 ($I_{SA}$) to the cathode emission current ($I_{CE}$) $I_{SA}/I_{CE}$ is 0.5 (50%) indicating no leakage.

CASE B: Leakage current $I_{LK}$=20 µA. The cathode emission current $I_{CE}$ is 1000 µA (from the high voltage unit) and $I_{SA}$=490 µA of current is intercepted by the shaping, shaping aperture 116. As a result, the software computes a ratio of 0.49 indicating that there is leakage.

CASE C: Leakage current $I_{LK}$ is 20 µA. The servo which is adapted to maintain current through the Faraday cup 140 has detected the fact that there was insufficient current in CASE B. As a result, the servo has increased the emission from the cathode 103 to compensate for the deficiency. Now the cathode emission current $I_{CE}$ is up to 1020 µA and the shaping aperture current $I_{SA}$ is 500 µA. Thus the software computes a ratio of 0.490196 which indicates the presence of a leakage current.

CASE D: There is no leakage current, $I_{LK}$=0. In this case the leakage current of CASE C has stopped, but the servo which maintains the Faraday cup current has not yet detected this change. The cathode emission current $I_{CE}$ is 1020 µA, the shaping aperture current $I_{SA}$ is 510 µA and the software computes a ratio of 0.50 which indicates no leakage.

In accordance with this invention, the ratio is calculated in software in real time given the shaping aperture current and the cathode emission current. Both of these currents are sent to an analog-to-digital converter. A flag is sent to the tool to warn the operator, or to stop the tool, if this ratio has deviated by more than a specified amount from the nominal, or correct ratio. For the example above, a deviation of 0.01 in a ratio of 0.5 alerts the operator of a 20 µA leakage current. Using low-noise amplifiers, this discrimination can be implemented.

On the left side of FIG. 3 there are the three cascaded servo loops 210, 220 and 230 adapted to control the three power supplies $V_H$, $V_C$, and $V_A$ by driving their input voltage control lines which control the output voltages therefrom. The power supplies 60 and 70 also have the output sample voltages $V_{FE}$ and $V_{CE}$ that are proportional to the current that the power supplies are delivering to their loads. Therefore the current through the $V_C$ power supply 60 is the filament emission current $I_{FE}$ and the current through $V_A$ power supply 70 is the cathode emission current $I_{CE}$. The inner most servo loop 210 is the filament servo where an analog difference equation controls the filament voltage to keep the filament emission current $I_{FE}$ constant and equal to the filament emission current $I_{FE}$ desired. The intermediate servo loop is the cathode emission servo loop 220 that sets the filament emission current $I_{FE}$ desired to maintain a constant cathode emission current $I_{CE}$. The outer servo loop 230 is handled by the lowest digital difference equation that tries to minimize the difference between current in the Faraday cup and a reference current set by the tool operator. There are other apertures in the E-beam column besides the shaping aperture 116, notably the blanking aperture 122, and the contrast aperture 132 which could remove large fractions of the E-beam current so the last servo loop guarantees that the portion of E-beam current that finally reaches the critical target 170 has a correct and constant value. The filament emission servo loop 210 is implemented with an analog difference equation and the cathode emission servo loop 220 and the Faraday cup servo loop 230 are implemented with digital difference equations.

Servo System to Control the Indirectly Heated Electron Beam Source

FIG. 3 shows a feedback loop where the E-beam current derived from electrons 119 striking a Faraday cup 140 is monitored. There is the problem that if a leakage current $I_{LK}$ occurs, the Faraday cup 140 detects a lower beam current, then the servo loops tend to heat the filament 101 and thus the cathode 103 more to compensate for the leakage current $I_{LK}$. This creates the problem of hazards created by excessive leakage current $I_{LK}$. The method and apparatus of this invention are directed to resolving this problem by taking extraordinary measures to terminate operation under such conditions when excessive leakage current $I_{LK}$ is detected by the method and system of this invention, as will be understood by a review of the description which follows.

The following description is largely based upon copending, commonly assigned U.S. patent application (Attorney Docket No. NC99-249) Ser. No. 09/492,076, filed on Jan. 27, 2000 of Samuel K. Doran and Steven D. Golladay for "Servo Control for High Emittance Electron Source".

Referring now to the drawings, and more particularly to FIG. 3, there is shown a schematic block diagram of a preferred form of the multiple closed loop control system 150 in accordance with the invention. While closed loop automatic control systems are generally well-known and understood and numerous respective elements illustrated FIG. 3 will be familiar to those skilled in the art, no portion of the subject matter shown is admitted to be prior art in regard to the present invention.

In FIG. 3 a schematic diagram of the electron emission source. 105 of the indirectly heated cathode type is shown which comprises two basic elements which are a filament 101 and a cathode 103. It should be understood that the invention does not require particular details of the implementation of the electron emission source 105 but can be applied to any electron source having an indirectly heated cathode 103. Further, the principles of the invention can be readily applied to electron sources having one or more additional elements such as intermediate electrodes, extraction grids and the like.

A current sensor, such as a Faraday cup 140, is provided to sample E-beam current accurately by periodically sampling the E-beam current at selected times such as intervals of stage movement between exposures and is referenced at the same potential as the target 170 (e.g. a resist-coated wafer) as the ground or reference potential The Faraday cup 140 (as well as E-beam target 170) of FIG. 1, for purposes of this discussion, will be considered as an element of the E-beam lithography exposure apparatus 100 of FIG. 1. The Faraday cup 140 is a generic term for E-beam current sensors that can take occasional samples of the E-beam current for feedback purposes. However, it is to be understood that such a current sensor is not necessary to development of an E-beam from the indirectly heated cathode 103.

To properly operate the electron emission source 105, the three voltage sources 50, 60 and 70 must be applied to these respective elements. The sources 50, 60 and 70 are depicted as being connected in series, as is preferred. For purposes of the invention, all of these voltages sources are voltage programmable. The unit which supplies the filament voltage ($V_H$) power source 50 provides a heating current to the filament 101 and produces a filament emission current $I_{FE}$ that is a function of filament temperature and the filament work function, as is well-understood in the art. However, during use and/or over time, the impedance of the filament 101 is subject to change because of aging, i.e. evaporation of metal from the filament 101. Therefore, changes in the magnitude of the actual emission current will drift as time passes.

As is well understood in the art, the emissions from the cathode 103 are also functionally related to the temperature of the cathode 103 and the work function of the material from which the cathode 103 is formed as well as the energy of the electrons incident thereon which are accelerated from the filament 101 to the cathode 103 by the bombardment voltage ($V_C$) power source 60. The heating power applied to the cathode 103 is equal to the product of the net amperes of filament emission current $I_{FE}$ and the bombardment voltage from $V_C$ power source 60. The temperature of the cathode is the integral of the incoming watt-seconds to the cathode minus the radiated and conducted power from the cathode 103.

The voltage controlled $V_C$ power source 60 and voltage controlled acceleration voltage $V_A$ power source 70 can easily provide voltage outputs $V_{FE}$ and $V_{CE}$ on lines 160 and 162 respectively proportional to the currents $I_{FE}$ and $I_{CE}$ passing through respective legs of the circuit using techniques well-understood in the art. The current passing through $V_C$ power source 60 is the filament emission current $I_{FE}$. The current passing through $V_A$ power source 70 is the cathode emission current $I_{CE}$.

These voltages $V_{FE}$ and $V_{CE}$ on lines 160 and 162 which are proportional to the real-time emission currents can be used by the closed loop servo system for precise control of these critical emission currents.

The filament emission current $I_{FE}$ from the filament 101 and cathode emission current $I_{CE}$ from the cathode 103 are both exponential functions of their temperatures and the temperatures are subject to many time-varying drift sources. The exponential nature of the functions means that small changes in temperatures can cause large changes in emission currents $I_{FE}$ and $I_{CE}$. The filament 101 and the cathode 103 must be heated to incandescent temperatures at which considerable heat losses occur because of radiation and conduction. The amounts of these heat losses vary over time as the surrounding components change in temperature.

Also, the filament 101 and cathode 103 can transfer heat to and from each other by radiation since they are in close proximity. Further, the filament resistance increases with age and temperature. The servo system must deliver power to the filament 101 and cathode 103 to provide constant replenishment of heat lost through radiation and conduction to maintain the delicate and complex temperature equilibrium that has a natural tendency to drift with time. It should be appreciated that the control system architecture depicted in FIG. 3 has three closed feedback control loops 210, 220 and 230. This architecture provides several functional advantages since each loop can be individually and critically tuned to optimize performance of the respective loop. This capability is of particular importance in view of the wide range of time constants (e.g. of the filament 101 and cathode 103, as alluded to above and which can differ by several orders of magnitude in frequency response and phase) which must be accommodated by the control system.

Independence of tuning of the loops thus largely avoids unpredictable instabilities and the utilization of large gain in the control loop without engendering instability of the respective loops. The functional relationship between gain versus frequency and magnitude versus frequency of the three servo control loops is greatly different from one loop to another.

The connected, nested loops 210, 220 and 230 provide accuracy of measurement of E-beam current reaching the target 170 and the corresponding emission levels of the respective elements necessary to achieve it. Further, the nested loops also provide for the control system to operate with a single set point.

However, the E-beam tool has shaping, blanking, and contrast apertures which might intercept large fractions of the E-beam current in order to achieve uniform current dose over the entire projected pattern. The lowest servo loop 230 guarantees that the portion of E-beam current which finally reaches the target 170 (which is sampled by the Faraday cup 140) is correct and constant in value. Any drifts in amount of the current at the Faraday cup 140 with respect to time can be corrected by changing the set point on the cathode emission servo loop 230. Therefore, the filament emission current $I_{FE}$ and cathode emission current $I_{CE}$ can be properly regulated independently of the leakage current $I_{LK}$.

This invention provides the means to carefully measure $I_{CE}$ and $I_{SA}$ to determine the magnitude of the leakage current $I_{LK}$ and to send a signal on line 27 from a computer 24 to turn off the power supplied to the power supplies 50, 60 and 70 when the leakage current $I_{LK}$ exceeds a threshold.

In operation, a first analog difference amplifier 167 compares two inputs. The first input is the signal from a voltage $V_{REF}$ (representing a reference current set point $I_{REF}$) is input on line 166 the positive input of the first analog difference amplifier 167 which also receives on line 164 a voltage generated as a function of the current striking the Faraday cup 140, node 141 and the resistor 142 to the negative (subtractive) input of the difference amplifier 167. An example of a Faraday cup is shown in U.S. Pat. No. 4,608,493 of Hayafuji for "Faraday Cup".

The first analog difference amplifier 167 senses the difference between the voltage $V_B$ representing the actual Faraday cup current and an analog voltage $V_{REF}$ representing a desired reference current input $I_{REF}$ to the first digital difference amplifier 167. The output of the first digital difference amplifier 167, which reflects the digital value of the difference between the voltage $V_B$ and the voltage $V_{REF}$, is provided on line 168 to a first digital difference equation element 170. The first digital difference equation element 170 also amplifies the error with a gain that varies with frequency based on classical control theory such that the control loop is stable and accurate.

The output of first digital difference equation element 170 is provided as an analog voltage signal $V_{CED}$ on line 171 to a second analog difference amplifier 172 (as a set point that automatically varies with the E-beam current error the forward control being effected by the needed change in cathode emissions to provide desired E-beam current) while a voltage $V_{CE}$ (proportional to the net cathode emission current $I_{CE}$) is applied to a negative input to amplifier 172 on line 162 from the acceleration voltage $V_A$ power source 70. The difference or error in cathode emissions is provided on line 174 to a second digital difference equation element 176.

The output of the second difference equation element 176, when the difference equation embodied therein is evaluated, is input as a voltage $V_{DD}$ by connection through line 177 to a third difference amplifier 178 (as a set point that automatically varies with the cathode emission current error the forward control being effected by the needed change in filament emissions to provide desired E-beam current) while a voltage $V_{FE}$ proportional to the filament emission current $I_{FE}$ is applied on line 160 to a negative input of amplifier 178 from bombardment voltage $V_C$ power source 60. An output from the third analog difference amplifier 178 on line 179 represents the difference or error in filament emissions to analog difference equation element 180 which evaluates the difference or error. The output of analog difference equation element 180 supplies an analog signal on line 182 to the control the filament power supply $V_H$ to develop the required temperature to obtain the correct filament emission current $I_H$ from the filament power supply $V_H$.

Note that it is explained in the copending application of Doran et al., Ser. No. 09/492,076, that it is possible to control $I_{FE}$ ($V_C$) instead of controlling the cathode emission current $I_{CE}$ ($V_A$) and to control $V_A$ to control the cathode temperature. Other features of the circuit of FIG. 3 are explained there.

In the copending application there is an output line from an analog difference equation element shown therein to control the voltage and power applied to the filament 101 to develop the required temperature to obtain correct filament emission current $I_{FE}$.

In the above described arrangement of the control circuit of FIG. 3 it should be appreciated that the forward control function is always provided by the electron emissions of the respective elements which are automatically adjusted to compensate for changes in respective work functions" of the elements. The backward closed loop arrangement provides variable set points that accurately reflect the changes in work function over time and/or usage. The three loops 210, 220 and 230, described above, can thus be described as "cascaded".

It was noted above, that the first and second digital difference equations elements 176 and 170 are preferably digital but could be implemented by recursive processing while the analog difference equation element 180 which is preferably an analog element could be otherwise.

In general, in automatic control circuits, often referred to as servo arrangements, the response time or time constant of the controlled structure must be accommodated and maximum control or gain that can be used without engendering instability is desirable. To perform these functions optimally and with minimum operating margins, the control circuit must provide a time constant similar to that of the controlled structure. Further, the response to the time constant of the difference equation must be linear or substantially symmetrical for both positive or negative errors. Long time constants therefore require large values of resistance and capacitance which are often difficult to achieve within hardware and economic constraints. Electrolytic capacitors, for example, can provide large capacitance values but are polarized and do not have symmetrical properties for positive and negative voltages. Large values of resistance are subject to surface leakage on the resistor body and printed circuit noise and generate thermal noise. On the other hand, analog difference equations are generally simpler and provide enhanced performance when long time constants need not be provided.

As generally alluded to above, the time constants of a filament, and a large cathode may differ by several orders of magnitude due to their respective thermal masses. Therefore, the filament time constant can generally be accommodated by an analog circuit while the cathode emission current control will almost invariably require a digital circuit operating by recursive computations. A digital circuit may also provide a means or different loop compensations at different emission current operating points.

In view of the foregoing, it is readily seen that the invention provides an arrangement for stabilizing and maintaining electron emission and E-beam energy of a high-emittance electron source that effectively increases the useful lifetime of the filament 101. The accuracy of emission current regulation is sufficient to reduce E-beam current variation to negligibly low levels that do not affect target currents with respect to time. A single set point simplifies establishment of the desired emission current level. The cascaded closed-loop architecture in accordance with the invention allows each loop to be independently optimized and critically tuned independently of the other loops. The independence of the loops also facilitates fault location if a failure should occur in any loop and automatically compensates for the radiative, transfer of heat between the filament and cathode and/or other elements. Further, the independence of the cascaded loops allows application to the principles of the invention to directly heated cathode (e.g. filament) electron sources (in which case; the anode electrode would correspond to the cathode in the indirectly heated cathode embodiment described above) as well as indirectly, heated cathode sources having two, or more elements by employing different numbers of cascaded feedback loops.

The system of FIG. 3 can be employed as a semiconductor manufacturing tool as will be well understood by those skilled in the art of semiconductor manufacturing.

Figure 4A:
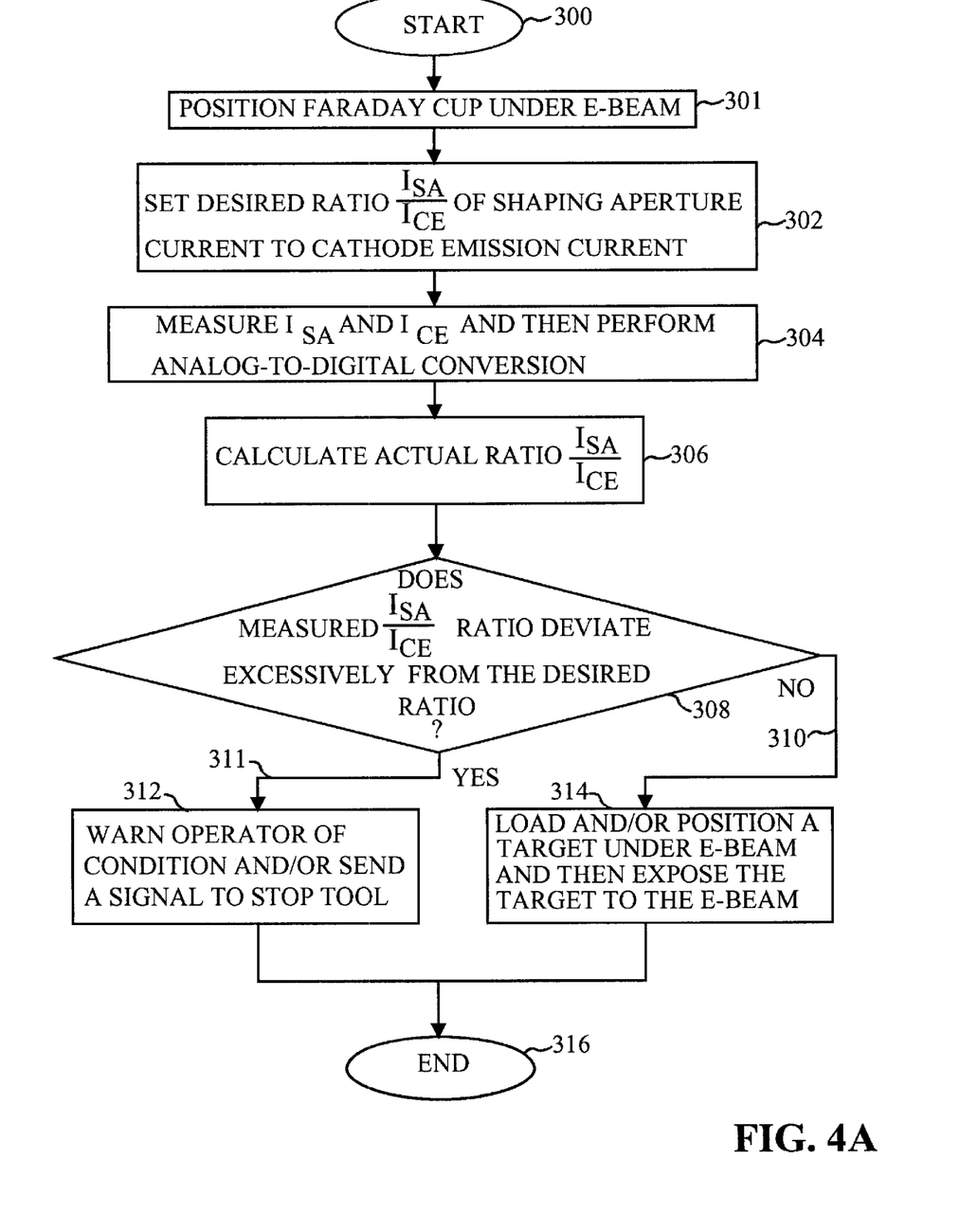
FIGS. 4A and 4B show flow charts for algorithms useful in the computer of FIG. 3 to energize an alarm or to turn the power supplies OFF if an alarm condition is found to exist.

FIG. 4A shows a flow chart for an algorithm useful in the computer 24 of FIG. 3 to energize an alarm 26 or to send a signal on line 27 to turn off the power to the system 150 in FIG. 3. The flow chart begins at step 300 and proceeds to a step 301 in which computer 24 (or an associated computer) and control devices moves the stage 160 in FIG. 1 to position the Faraday cup 140 under the E-beam 106. This assumes that the test for excessive leakage current would be done at the same time as the lowest servo level (e.g. that the beam current striking the target is correct.) For the leakage current check to be operational in real-time, there is no need to position the Faraday cup under the beam.

Next, in step 302, the computer 24 sets the desired ratio of $I_{SA}/I_{CE}$ of the shaping aperture current $I_{SA}$ to cathode emission current $I_{CE}$.

Next, in step 304 the current $I_{SA}$ is measured in the shunt 16 and sent as voltage $V_{SA}$ (since it represents $I_{SA}$) through the amplifier 19 on line 20 to the A/D converter 22 and the value of $V_{CE}$ (since it represents $I_{CE}$) from the power supply 70 on line 20 to the A/D converter 22.

In step 306, the measured ratio of $I_{SA}/I_{CE}$ ($V_{SA}/V_{CE}$) of the shaping aperture current $I_{SA}$ to cathode emission current $I_{CE}$ is calculated by the computer 24 based upon the signals received as inputs from the A/D converter 22, which passes on the values of $V_{CE}$ and $V_{SA}$ to computer 24.

In step 308, a test is made to determine . . . Does $I_{SA}/I_{CE}$ measured ratio deviate excessively from the desired ratio presented to the computer 24 in step 302?.

In step 308, if the answer is YES, i.e. an alarm condition is found to exist in which the leakage current is excessively large as determined in step 308, then the system proceeds on line 311 to step 312 causing the computer 24 to send a signal to the operator at the terminal of the computer 24 and/or sends a turn OFF signal on line 27 to the power supplies 50, 60 and 70 to stop the E-beam by removing power from the tool 100.

In step 308, if the answer is NO, then the system proceeds on line 310 to step 314 to load and/or position a target 170 such as a semiconductor wafer under the E-beam and then to expose the target to the E-beam through the reticle 126.

After either step 312 or step 314 in FIG. 4A, in step 316, the algorithm shown in FIG. 4A reaches an END.

Figure 4B:
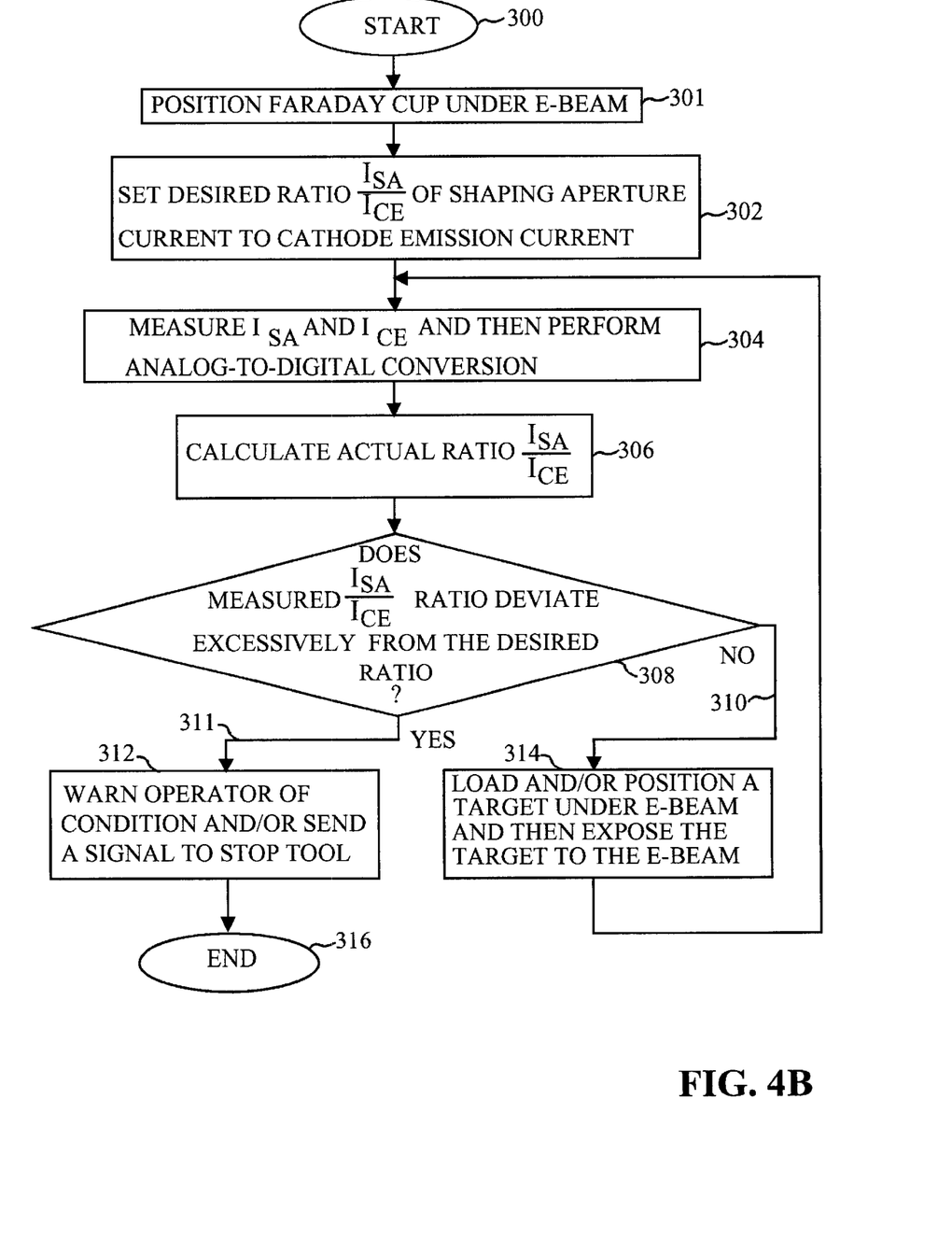

FIG. 4B. shows a modification of the algorithm of FIG. 4A. In FIG. 4B, the change from the sequence of steps in FIG. 4A is that after the target is exposed, as shown in step 314. Then, the algorithm loops back to step 304. The algorithm reaches an END only after step 312.

Figure 5A:
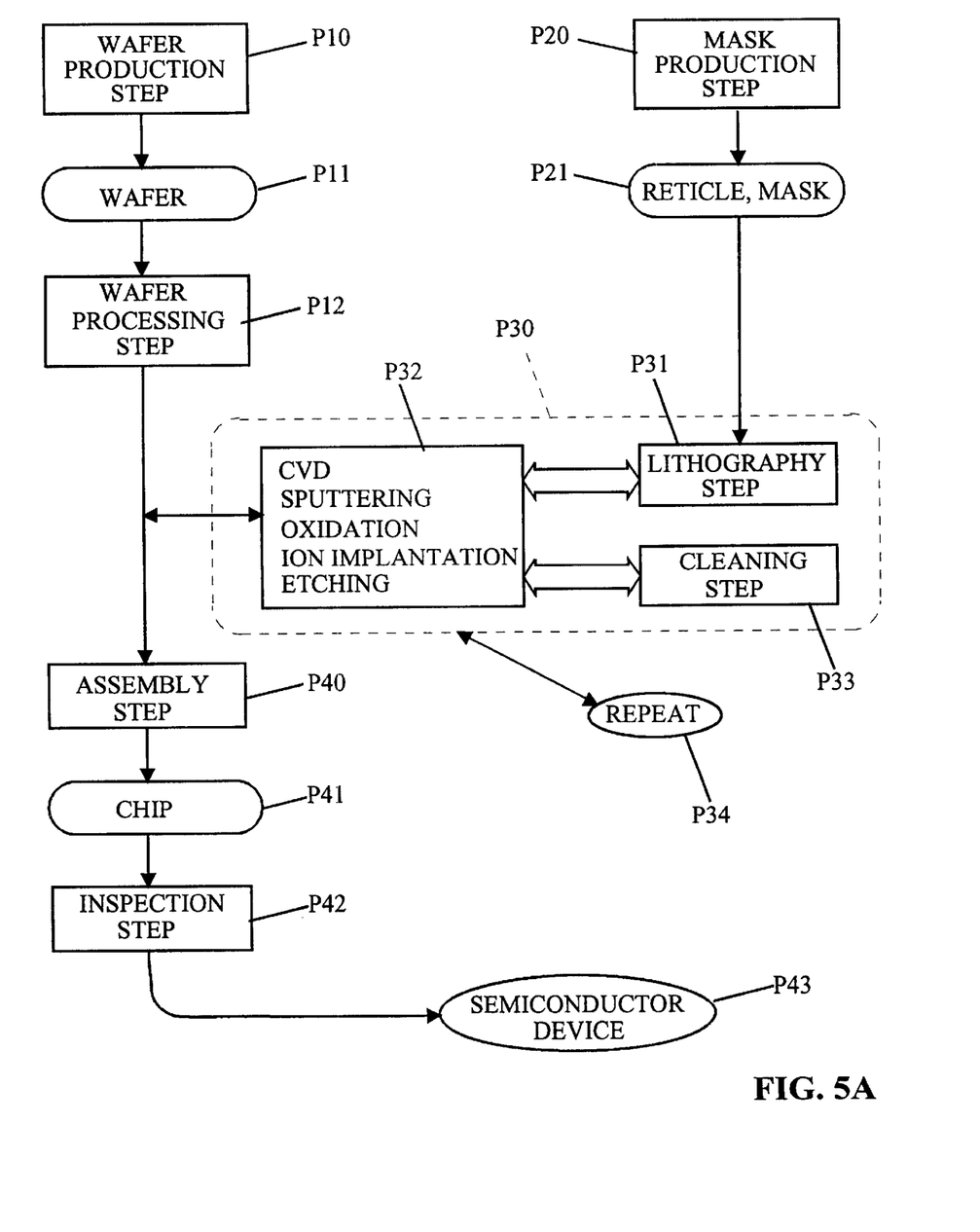
FIG. 5A is a flow chart of semiconductor fabrication method to which the apparatus of this invention can be applied and FIG. 5B shows a flow chart of lithography steps of FIG. 5A which are dominant steps in the method of FIG. 5A.

FIG. 5A shows a schematic block diagram of a process for manufacture of a semiconductor chip adapted to employing the apparatus and the method of this invention. The semiconductor fabrication method of FIG. 5A comprises mainly a wafer production step P10 (or wafer preparation step) which produces a finished wafer in step P11, a mask production step P20 (or mask preparation step) which produces a finished reticle, mask in step P21, a wafer processing step P12, an assembly step P40 yielding a chip P41 and an inspection step P42. Each step comprises several substeps as will be well understood by those skilled in the art. Among these main steps, the wafer processing step P12 is a most important step to achieve the specified finest pattern width and registration limit. In this step, the designed circuit patterns are stacked successively on the wafer from step P11 and many operative semiconductor chips like memory devices are formed on the wafer from step P11.

The wafer processing steps P12 comprises a step of thin film formation wherein a dielectric layer for insulation is formed or a metal layer for lead lines and for electrodes is formed. An oxidization step can be employed to oxidize the thin film or the wafer substrate. A lithography step P31 involves use of the reticle/mask P21 to form a photoresist or other resist pattern to process the thin film or wafer substrate selectively, a selected set of process steps P32 including etching the thin film or wafer substrate and implanting ions or impurities into the thin film or wafer substrate using the resist pattern from step P31 as a mask. There is the conventional resist stripping step to remove the resist from the wafer and chip inspection step. As indicated at P34, the wafer processing steps P30 are repeated as many times as necessary to make a semiconductor chip be operable as designed, as will be well understood by those skilled in the art.

Figure 5B:
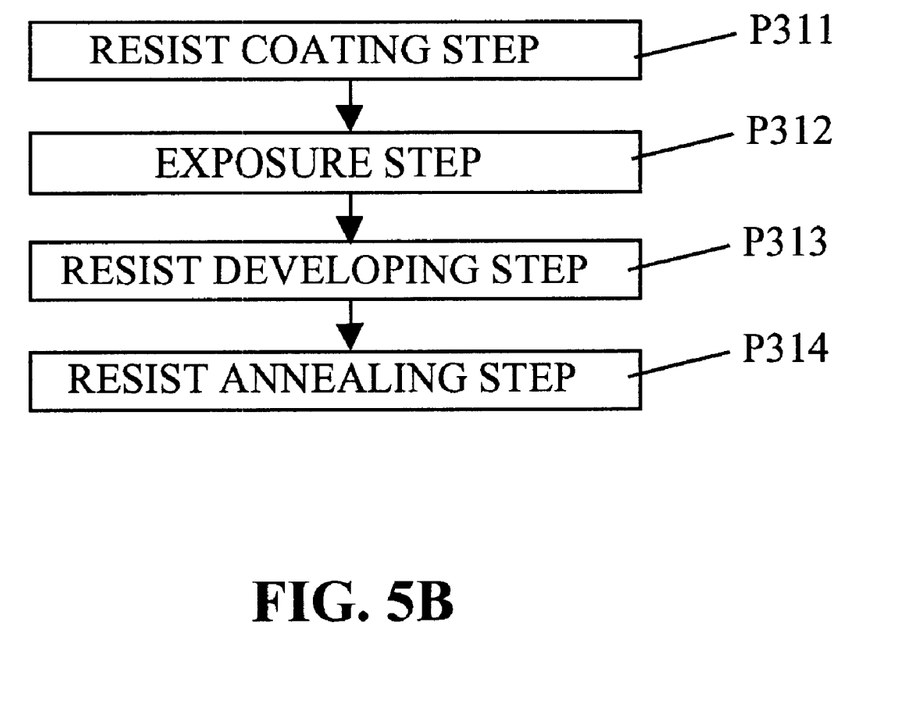

FIG. 5B shows a flow chart of lithography steps P31 of FIG. 5A which are dominant steps in the wafer processing steps P12/P30 adapted for employment with the method and apparatus of this invention. Lithography steps P31 comprise a resist-coat step P311 in which the wafer substrate is coated with resist on circuit elements formed in a previous steps. An exposure step P312 then exposes the wafer coated with resist through the reticle/mask of step P21 employing a deflector in accordance with this invention. A resist development step P313 follows for developing the resist exposed in exposure step P312 followed by a resist annealing step P314 performed to enhance durability of the resist pattern produced in step P313.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of operating an E-beam system including an E-beam source for generating an E-beam directed along a column axis comprising:

producing an E-beam directed towards means for measuring the E-beam, generating a leakage signal representing leakage current emitted from the E-beam, and generating an excess leakage output signal when the result of a comparison with a desired value is excessive.

2. The method of claim 1 wherein leakage current is checked in real time without repositioning a Faraday cup under the E-beam.

3. The method of claim 1 including providing the excess leakage output signal as an emergency output signal.

4. The method of claim 1 including providing a filament heated by an electric current, providing a cathode bombarded with electrons from the filament for producing the E-beam, and employing a filament control signal for controlling the filament heating current.

5. The method of claim 1 including generating an excess leakage signal which produces an OFF signal for stopping production of the E-beam by turning OFF voltage/power sources for producing the E-beam in response to the excess leakage output signal.

6. The method of claim 1 including:

producing an E-beam by heating a filament for emitting electrons proximate to a cathode aligned therewith, and providing an aperture located along the column axis, providing an adjustable filament emission power for generating an output to accelerate electrons from the filament to bombard the cathode, supplying cathode emission power supply for generating a cathode emission current and voltage to accelerate the E-beam from the cathode along the column axis, measuring the cathode emission current, providing for an aperture to be adapted to intercept electrons from the cathode, thereby producing an aperture current, measuring the aperture current, generating a ratio of the aperture current to the cathode emission current, testing to determine whether the ratio is within a limit, and generating an excess leakage output signal when the ratio is outside of the limit.

7. The method of claim 6 including providing an OFF signal for causing turning off power supplied to the B-beam when the ratio is outside of the limit by generating an excess leakage signal.

8. The method of claim 6 including generating an emergency output signal when the ratio is outside of the limit.

9. The method of claim 6 including providing a filament control signal for adjusting filament emission power.

10. An E-beam method for generating an E-beam directed along a column axis comprising:

providing an electron gun including a filament, a cathode located along the axis below the filament, and a shaping aperture located along the column axis below the cathode, providing a first power supply for heating the filament to cause thermionic emission of electrons, providing a second voltage source for supplying a bombardment accelerating voltage to direct the electrons along the column axis towards the cathode, providing a third voltage source coupled to the shaping aperture for supplying a beam accelerating voltage to direct an E-beam generally along the column axis, the E-beam comprising energized electrons couple to the beam accelerating voltage, generating an emission current signal representing the electron source current emitted from the electron source, generating a shaping aperture current signal representing current flow at the shaping aperture, and comparing the shaping aperture current signal and the current emission current signal and providing a comparison ratio output signal, testing determining whether the comparison ratio output signal is within a limit, and generating an output signal when the comparison output signal is outside the limit.

11. A semiconductor fabrication method in accordance with claim 10 wherein:

a wafer production step is performed including wafer preparation, a mask production step is performed including mask preparation step, a wafer processing step, an assembly step and an inspection step, each step comprising several substeps including steps of wafer processing to achieve a specified finest pattern width and registration limit whereby designed circuit patterns are stacked successively on the wafer and many operative semiconductor chips are formed on the wafer, said wafer processing step comprising a step of thin film formation step wherein dielectric layer for insulation or a metal layer for lead line and for an electrode are formed, an oxidization step to oxidize a thin film or wafer substrate, a lithography step to form a resist pattern to process the thin film or wafer substrate selectively, and a processing step to etch the thin film or wafer substrate and to implant the ion or impurity into the thin film or wafer substrate using the resist pattern as a mask, a resist stripping step to remove the resist from the wafer and chip inspection step, said wafer processing step being repeated as many times as necessary to make semiconductor chip be operable as designed.

12. The method of claim 10, further including generating an alarm signal when the comparison ratio output signal that is outside the limit.

13. The method of claim 10, further including generating an OFF signal when the comparison ratio output signal is outside the limit.

14. The method of claim 10, further including providing a filament control signal for controlling filament current.

15. The method of claim 10, further including providing an OFF signal to voltage/power sources in response to a comparison ratio output signal outside the limit.

16. An E-beam apparatus including an E-beam source for generating an E-beam directed along a column axis comprising:

beam means for producing an E-beam directed towards means for measuring the E-beam, first signal means for generating a leakage signal representing leakage current emitted from the E-beam, and second signal means for generating an excess leakage output signal when the result of a comparison with a desired value is excessive.

17. The apparatus of claim 16 wherein leakage current is checked in real time without repositioning a Faraday cup under the E-beam.

18. The apparatus of claim 16 including the excess leakage signal comprises an emergency output signal.

19. The apparatus of claim 16 including means for providing a filament control signal for controlling filament heating current associated with the means for producing an E-beam.

20. The apparatus of claim 16 including the second signal means for generating the excess leakage output signal that produces an OFF signal for stopping operation of the means for producing the E-beam by turning OFF voltage/power sources to the means for producing an E-beam in response to the excess leakage output signal.

21. The apparatus of claim 16 wherein:

the beam means includes a filament emitting electrons with a cathode proximate thereto and aligned therewith, and a conductive aperture located along the column axis, an adjustable filament emission power supply means for generating an output to accelerate electrons from the filament to bombard the cathode, cathode emission power supply means for generating a cathode emission current and voltage to accelerate the E-beam from the cathode along the column axis, cathode emission current means for measuring the cathode emission current, the conductive aperture being adapted for intercepting electrons from the cathode producing an aperture current, aperture current measurement means for measuring the aperture current, comparison means for generating a ratio of the aperture current to the cathode emission current, testing means for determining whether the ratio is within a limit, and the second signal means generating the excess leakage output signal when the ratio is outside of the limit.

22. The apparatus of claim 21 including means for providing an OFF signal to the power supply means when the ratio is outside of the limit by generating an excess leakage signal which stops operation of the beam means by turning OFF voltage/power sources to the beam means in response to the excess leakage signal.

23. The apparatus of claim 21 including means for generating an emergency output signal when the ratio is outside of the limit.

24. The apparatus of claim 21 including filament emission control means for providing a filament control signal for adjusting the filament emission power supply means.

25. An E-beam apparatus for controlling an E-beam directed along a column axis comprising:

an electron gun including a filament, a cathode located along the axis below the filament, a shaping aperture located along the column axis below the cathode, a first voltage source for heating the filament to cause thermionic emission of electrons, a second voltage source for supplying a bombardment accelerating voltage to direct the electrons along the column axis towards the cathode, a third voltage source coupled to the shaping aperture for supplying accelerating voltage to direct an E-beam generally along the column axis, the E-beam comprising energized electrons couple to the beam accelerating voltage, means for generating an emission current signal representing the electron source current emitted from the electron source, means for generating a shaping aperture current signal representing current flow at the shaping aperture, and comparison means for comparing the shaping aperture current signal and the current emission current signal and to provide a comparison ratio output signal, testing means for determining whether the comparison ratio output signal is within a limit, and means for generating an output signal when the comparison output signal is outside the limit.

26. The apparatus of claim 25, further including means for providing OFF signal to voltage/power sources in response to a comparison ratio output signal outside the limit.

27. The apparatus of claim 25, further including means for generating an alarm signal when the comparison ratio output signal that is outside the limit.

28. The apparatus of claim 25, further including means for generating an OFF signal in response to a comparison ratio output signal outside the limit.

29. The apparatus of claim 25, further including means for providing a filament control signal for controlling filament current.

\* \* \* \* \*